United States Patent [19]

Ahmed

[11] Patent Number: 4,772,083

[45] Date of Patent: Sep. 20, 1988

[54] OPTICAL FIBER INTERFEROMETER

[75] Inventor: M. Jamil Ahmed, Maple Ridge, Canada

[73] Assignee: Microtel Limited, Vancouver, Canada

[21] Appl. No.: 917,729

[22] Filed: Oct. 10, 1986

[51] Int. Cl.[4] .............................................. G02B 6/10
[52] U.S. Cl. ................................ 350/96.14; 350/96.29
[58] Field of Search ............... 350/96.12, 96.13, 96.14, 350/96.15, 96.29, 96.17

[56] References Cited

U.S. PATENT DOCUMENTS

| 4,048,591 | 9/1977 | Auracher | 332/7.51 |
| 4,070,094 | 0/0000 | Martin | 350/96.14 |

FOREIGN PATENT DOCUMENTS

| 0158616 | 9/1982 | Japan | 350/96.14 |

OTHER PUBLICATIONS

Jaeger et al., "Asymmetric slab. . . Electric Fields", *Journal of Lightwave Tech.*, vol. LT-5, No. 6, Jun. 1987, pp. 745–750.
K. H. Wanser et al., "Making Sense of Fiber Optic Sensors," *Photonics Spectra*, Oct., 1983, pp. 61, 62, 66.
C. H. Bulmer et al., "Linear Interferometric Modulator for Electromagnetic Field Detection," Naval Research Laboratory, Washington, DC, 1/29/80, 4 pages.
H. I. Bassen et al., "An RF Field Strength Measurement System Using An Integrated Optical Linear Modulator," Bureau of Radiological Health, Food and Drug Administration, Rockville, MD., 20857, and Naval Research Laboratory, Washington, DC 20375, pp. 317–318.
W. E. Martin, "A New Waveguide Switch/Modulator for Integrated Optics," *Applied Physics Letters*, vol. 26, No. 10, May 15, 1975, pp. 562–564.
M. J. Ahmed et al., "Comparatorless Electrooptic ADC," *Applied Optics*, vol. 19, No. 18, Sep. 15, 1980, pp. 3050–3052.
J. P. Donnelly et al., "A High-Frequency GaAs Optical Guided-Wave Electrooptic Interferometer Modulator," *IEEE Journal of Quantum Electronics*, vol. QE-21, No. 1, Jan., 1985, pp. 18–21.
V. Ramaswamy et al., "Balanced Bridge Modulator Switch Using Ti-Diffused LiNbO3 Strip Waveguides," *Applied Phys. Lett.*, 32(10), May 15, 1978, pp. 644–646.
T. R. Ranganath et al., "Ti-Diffused LiNbO3 Branched-Waveguide Modulators: Performance and Design," *IEEE Journal of Quantum Electronics*, vol. QE-13, No. 4, Apr. 1977, pp. 290–295.
Y. Ohmachi et al., "Electro-optic Light Modulator With Branched Ridge Waveguide," *Applied Physics Letters*, vol. 27, No. 10, Nov. 15, 1975, pp. 544–546.
R. A. Becker et al., "Wide-Band Electrooptic Guided--Wave Analog-to-Digital Converters," *Proceedings of the IEEE*, vol. 72, No. 7, Jul. 1984, pp. 802–819.

(List continued on next page.)

*Primary Examiner*—Eugene R. LaRoche
*Assistant Examiner*—Seung Ham
*Attorney, Agent, or Firm*—Christensen, O'Connor, Johnson & Kindness

[57] ABSTRACT

An optical fibre interferometer particularly adapted to provide a light output that is modulated in relation to the intensity of an electromagnetic field includes a single-mode fibre of substantially non-electrooptic material (20, 22 and 24) to which has been spliced (at 26 and 28) a single-mode fibre of substantially electrooptic material (30). When the interferometer is placed in an electromagnetic field, the optical characteristics of the substantially electooptic fibre are varied, but the optical characteristics of the substantially non-electrooptic fibre are not. As a result, the light passing through the substantially non-electrooptic and electrooptic fibres undergoes a differential phase shift, causing interference upon light recombination that provides the desired light output modulation. Embodiments in which the fibre of substantially electooptic material is replaced by an optical waveguide of substantially electrooptic material, either formed separately (50, FIG. 3) or directly (70, FIG. 4 on the optical fibre itself, are discussed, as is the broad applicability of the interferometer to any situation in which an external parameter is to be measured.

18 Claims, 2 Drawing Sheets

OTHER PUBLICATIONS

B. Culshaw et al., "Integrated Optic Frequency Shifter Modulator," *Electronics Letters,* vol. 17, No. 3, Feb. 5, 1981, pp. 135–136.

H. F. Taylor, "An Optical Analog-to-Digital Converter-Design and Analysis," *IEEE Journal of Quantum Electronics,* vol. QE-15, No. 4, Apr. 1979, pp. 210–216.

H. F. Taylor et al., "Electrooptic Analog-to-Digital Conversion Using Channel Waveguide Modulators," Naval Ocean Systems Center, San Diego, CA., 92152, 4 pages.

H. F. Taylor, "An Electrooptic Analog-to-Digital Converter," *Proceedings Letters,* pp. 4524–4525.

F. J. Leonberger, "High-speed Electrooptical Signal Conversion Devices," Lincoln Laboratory, Massachusetts Institute of Technology, Lexington, MA, 6 pages.

"4-Bits Digitally Driven Integrated Amplitude Modulator For Data Processing," E. L. 14th, vol. 16, No. 4, Feb. 1980.

F. J. Leonberger et al., "High-Speed Electro-Optic Analog-To-Digital (A/D) Converter," SPIE vol. 176–Guided Wave Optical Systems & Devices II, 1979, pp. 28–35.

F. Auracher et al., "Method for Measuring the rf Modulation Characteristics of Mach–Zehnder-Type Modulators," *App. Phys. Lett.,* 36(8), Apr. 15, 1980, pp. 626–629.

R. F. Becker, "Traveling-Wave Electro-Optic Modulator With Maximum Bandwith-Length Product," *Appl. Phys. Lett.,* 45(11), Dec. 1, 1984, pp. 1168–1170.

F. J. Leonberger, "High-Speed Operation of $LiNbO_3$ Electro-Optic Interferometric Waveguide Modulators," *Optics Letters,* vol. 5, No. 7, Jul. 1980, pp. 312–314.

W. K. Burns et al., "Interferometric Waveguide Modulator With Polarization–Independent Operation," *Appl. Phys. Lett.,* 33(11), Dec. 1, 1978, pp. 944–947.

R. A. Becker, "Multigigahertz Lumped-Element Electrooptic Modulators," *IEEE Journal of Quantum Electronics,* vol. QE-21, No. 8, Aug. 1985, pp. 1144–1146.

R. A. Becker, "Broad-Band Guided-Wave Electrooptic Modulators," *IEEE Journal of Quantum Electronics,* vol. QE-20, No. 7, Jul. 1984, pp. 723–727.

F. J. Leonberger, "Applications of Guided-Wave Interferometers," *Fiberoptic Technology,* Mar. 1982, pp. 125–129.

"A-D Converter Pushes Gigabits," *Electronics,* Jun. 16, 1982, pp. 48–49.

H. Ito et al., "Integrated Astable Optical Multivibrator Using Mach–Zehnder Interferometric Optical Switches," Research Institute of Electrical Communication, Tohoku University, Katahira 2-1-1, Sendai 980, Japan, May 28, 1980.

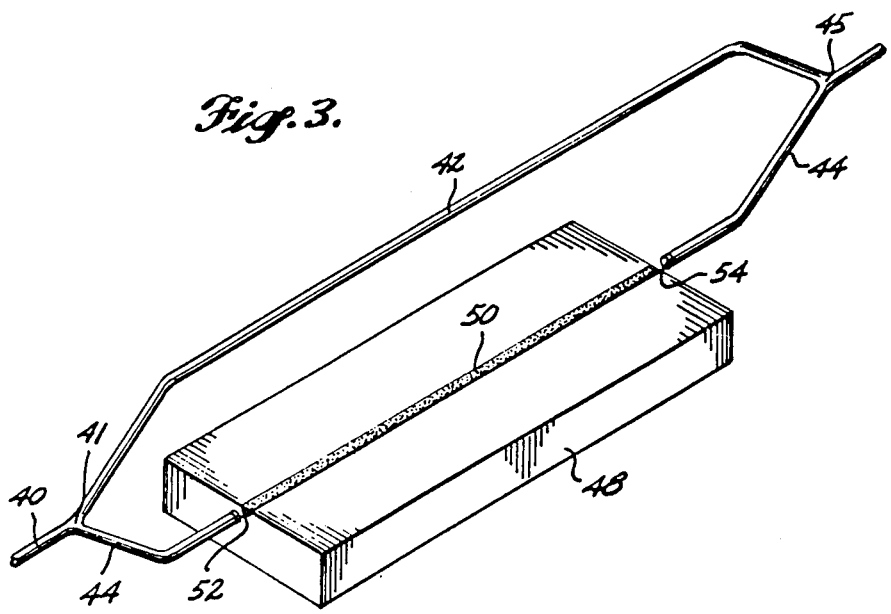
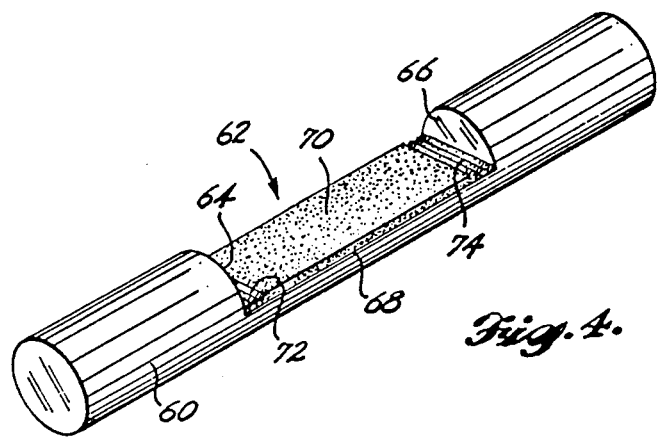

OPTICAL FIBER INTERFEROMETER

FIELD OF THE INVENTION

This invention generally relates to optical interferometers that are responsive to an external parameter to modulate or switch the light passing through the interferometer, and more particularly to such interferometers in which at least one of the branches consists of an optical fibre.

BACKGROUND OF THE INVENTION

Integrated optical versions of the classical Mach-Zehnder optical interferometer are known to the prior art and have found application as an A/D converter, a D/A converter, an astable multivibrator, a bistable device, an optical logic device, and an electromagnetic field sensor.

With reference now to FIG. 1, an integrated optical interferometer is depicted as including a substrate 10 of optically transmissive material and an optical waveguide 12 formed therein by metal diffusion into an etched pattern of a mask formed on a substantially planar surface 10A of the substrate. Waveguide 12 is electrooptic, that is, its optical characteristics substantially change in the presence of an electromagnetic field. Waveguide 12 includes an input branch 12A which diverges into two intermediate (and parallel) branches 12B, 12C, which in turn reconverge into an output branch 12D. Light is coupled to and from the exposed ends of input branch 12A and output branch 12D, respectively, by conventional optical couplers (not illustrated). Metallic electrodes 14 and 16 are formed on the top surface 10A of the substrate on either side of waveguide branch 12B. The application of a voltage across electrodes 14 and 16 varies the optical characteristics of waveguide branch 12B, but not those of waveguide branch 12C. As a result, the phase of the light commonly supplied to waveguide branches 12B and 12C from input branch 12A is differentially varied as it passes through branches 12B and 12C, producing interference at their reconvergence into output branch 12D. Accordingly, the light exiting from output branch 12D is modulated in relation to the magnitude of the voltage applied to electrodes 14 and 16.

The applications of integrated optical interferometers have been limited by the necessity of using metallic electrodes for modulation. As a result, an electromagnetic field cannot be sensed directly by the interferometer. The presence of conductive material on the substrate makes the interferometers vulnerable to various undesired phenomena, such as lightning. The interferometer efficiency, being directly proportional to the length of the electrodes and inversely proportional to the separation therebetween, is limited by currently-available fabrication techniques. The shape of the interferometer is also restricted to the linear, substantially planar form illustrated in FIG. 1 by the necessity of producing the waveguide through the use of metal diffusion and avoiding bends in the waveguide.

SUMMARY OF THE INVENTION

The limitations of integrated optical interferometers are substantially overcome by the optical fibre interferometer of the present invention which can be used in any interferometric application in which it is desired to provide a light output that is modulated in relation to an external parameter.

The optical fibre interferometer comprises:

An input branch, an output branch, and first and second intermediate branches, each of the branches being optically transmissive and one of the intermediate branches consisting of an optical fibre;

Means optically coupling the input branch to the first and second intermediate branches, and means optically coupling the first and second intermediate branches to the output branch;

One of the intermediate branches being composed substantially of material that is substantially optically inactive when subjected to the external parameter, and the other of the intermediate branches being composed substantially of material that is substantially optically active when subjected to the external parameter.

In the preferred application, the external parameter is an electromagnetic field, so that one of the intermediate branches is subtantially composed of material that is substantially non-electrooptic and the other of the intermediate branches is substantially composed of material that is substantially electrooptic.

The interferometer may consist entirely of optical fibres. Alternatively, one intermediate branch may be an optical fibre and the other intermediate branch may include an optical waveguide consisting of substantially electrooptic material. This waveguide may be formed on the optical fibre, such as by the deposition of a substantially electrooptic material on a surface of the fibre, or may be formed separately from the optical fibre, such as by metallic diffusion into a substrate of substantially electrooptic material.

BRIEF DESCRIPTION OF THE DRAWINGS

The invention can best be understood by reference to the following portion of the specification, taken in conjunction with the accompanying drawings, in which:

FIG. 3 is a pictorial illustration of a second embodiment of the optical fibre interferometer; and, FIG. 4 is a pictorial illustration of a third embodiment of the optical fibre interferometer.

DESCRIPTION OF THE PREFERRED EMBODIMENT

Figure 2:
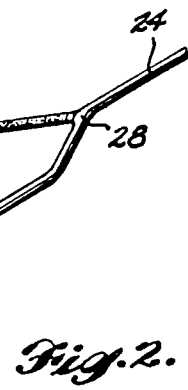
FIG. 2 is a pictorial illustration of a first embodiment of the optical fibre interferometer of the present invention.

With reference to FIG. 2, a first embodiment of the optical fibre interferometer is formed from a single-mode fibre of substantially non-electrooptic material and a single-mode fibre of substantially electrooptic material. The fibre of non-electrooptic material consists of three successive lengths 20, 22 and 24 which may be formed from either a continuous piece of the same material or from separate pieces of the same or different materials which are spliced together at 26 and 28. The fibre of electrooptic material preferably is formed from a single length 30 whose ends are spliced to the fibre of nonelectrooptic material at 26 and 28. The fibres are further fabricated so that lengths 22 and 30 diverge from each other as they extend from splice 26, then extend in parallel, then reconverge towards splice 28. As can be appreciated, fibre lengths 20, 22 and 30, and 24 accordingly form the input, intermediate and output branches of an optical interferometer consisting entirely of optical fibres.

When the interferometer in FIG. 2 is placed in an electromagnetic field, the optical characteristics of the intermediate branch thereof consisting of fibre length 30 are varied, but the optical characteristics of the intermediate branch consisting of fibre length 22 are not. In a manner similar to the integrated optical interferometer previously discussed, the resultant phase shift of the light arriving at splice 28 from lengths 22 and 30 causes interference so that the light passing into the output branch consisting of fibre length 24 is modulated in relation to the intensity of the applied electromagnetic field.

Figure 1:
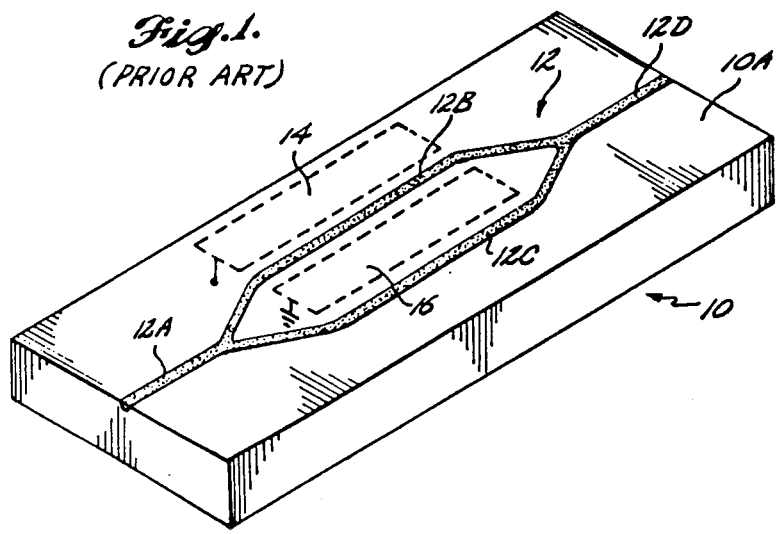
FIG. 1 is a pictorial illustration of a prior art integrated optical interferometer, as previously discussed.

In contrast to the integrated optical interferometer of FIG. 1, no electrodes are required. Accordingly, the optical fibre interferometer in FIG. 2 can be used to measure an electromagnetic field directly, is not subject to the phenomena that might otherwise adversely affect an interferometer using metallic electrodes, can have a high degree of modulator efficiency inasmuch as there is no limitation on its length, and can be arranged in various configurations, including a linear configuration, a spiral configuration, a coiled-cylindrical configuration, and so forth.

Although the materials chosen for the non-electrooptic and electrooptic branches of the optical fibre interferometer in FIG. 2 should each be optically transmissive and be capable of being formed into a fibre, they must substantially differ in the relative responsiveness of their optical characteristics to the same electromagnetic field. The optical characteristics of many materials suitable for use as an optical fibre are affected to a greater or lesser degree by electromagnetic fields. In the optical fibre interferometer of the present invention, the characterization and choice of a material as nonelectrooptic or electrooptic is dictated to a certain extent by the application for which the interferometer is designed. Those skilled in the art accordingly will appreciate that any choice of materials may be made that would result in a detectable and repeatable phase shift over the desired range of electromagnetic field intensity to be measured.

At the present, most applications can be accommodated by choosing either lithium niobate or lithium tantalate, each of which has been fabricated into the form of a fibre, as the electrooptic material, and by choosing silicon dioxide as the non-electrooptic material. The splices of the interferometer may be fabricated conventionally through the use of fusion-arc techniques.

Due to its construction, the optical fibre interferometer finds widespread application, including the measurement of electromagnetic fields (specifically, high voltage measurement and RF signal power detection), measurement of temperature, and optical signal processing (including modulation, switching and other logic functions).

With reference now to FIG. 3, a second embodiment of the optical fibre interferometer includes a single-mode fibre of substantially nonelectrooptic material (such as silicon dioxide), in combination with a metal diffused electrooptic waveguide formed in a suitable substrate. The fibre includes a length 40 that is spliced at 41 to lengths 42 and 44 which diverge from each other, extend parallel to each other, and then reconverge to be joined at splice 45 with a length 46. Although length 42 is continuous, length 44 is not and has interposed between its discontinuous ends a substrate 48 having a metal diffused, electrooptic waveguide 50 formed therein. Light exiting from a first discontinuous end of length 44 (adjacent splice 41) is coupled to an exposed end of waveguide 50 by an appropriate optical coupler, such as lens 52, and light exiting from the other exposed end of optical waveguide is coupled to the second discontinuous end of length 44 by a similar optical coupler, such as lens 54. An exemplary material for substrate 48 is lithium niobate, and waveguide 50 may be formed therein by conventional indiffusion of titanium or by other conventional methods.

It will be noted that in the optical fibre interferometer in FIG. 2, one intermediate branch is entirely composed of substantially non-electrooptic material and the other intermediate branch is entirely composed of substantially electrooptic material. In contrast, in the optical fibre interferometer in FIG. 3, one intermediate branch is entirely composed of substantially non-electrooptic material (e.g., fibre length 42) and the other intermediate branch is partially composed of substantially non-electrooptic material (e.g., fibre length 44) and partially composed of substantially electrooptic material (e.g., electrooptic waveguide 50). Light passing through these respective branches is subjected to a differential phase shift when they are placed in an electromagnetic field, resulting in interference upon recombination and a resultant modulation of the light exiting from the interferometer that is related to the intensity of the electromagnetic field.

With reference to FIG. 4, a third embodiment of the optical fibre interferometer includes an optical fibre of substantially non-electrooptic material (such as silicon dioxide) on which has been formed an electrooptic waveguide. Optical fibre length 60 of substantially non-electrooptic material is notched at 62 to define end faces 64 and 66 which are longitudinally spaced along fibre length 60 and situated at the opposite ends of longitudinal, substantially planar surface 68 thereof. A waveguide 70 consisting of a layer of substantially electrooptic material (such as niobium pentoxide) is formed on longitudinal surface 68 by conventional deposition techniques, so as to extend from end face 64 to end face 66. An optical coupler, such as a grating coupling 72, is formed in waveguide 70 adjacent end face 64, and a similar optical coupler, such as grating coupler 74, is formed in waveguide 70 adjacent end face 66.

The optical fibre interferometer in FIG. 4 can be seen to include an input branch of subtantially non-electrooptic material (e.g., that portion of fibre length 60 extending to end face 64), an output branch of substantially non-electrooptic material (e.g., that portion of fibre length 60 extending from end face 66), an intermediate branch of substantially electrooptic material (e.g., waveguide 70), and an intermediate branch of substantially nonelectrooptic material (e.g., that portion of fibre length 60 intermediate end faces 64 and 66 and underlying waveguide 70). Light in the input branch both exits through end face 64 and passes into the intermediate branch underlying waveguide 70. Substantially all of the light exiting through end face 64 is directed into a first end of waveguide 70 by grating coupler 72, and substantially all of the light at the other end of waveguide 70 is directed by grating coupler 74 onto end face 66. As a result, the input light is split at the location of end face 64 to proceed thereon along the intermediate branches including waveguide 70 and the underlying portion of fibre length 60, and is recombined at the location of end face 66. The optical fibre interferometer in FIG. 4 functions in a manner identical to that previously described, with the applied electromagnetic field resulting in interference at the location of end face 66 due to differential phases of the light passing through the substantially non-electrooptic and electrooptic branches thereof, so as to produce a related and corresponding modulation of the light in fibre length 60.

While the invention has been described with respect to an interferometer that includes a substantially electrooptic material for use in measuring the intensity of an electromagnetic field, it will be appreciated by those skilled in the art that the invention is not so limited and can be used in any interferometric application in which an external parameter is to be measured. Acoustic and magnetic parameters, and the consequent use of acoustooptic and magnetooptic materials, are thus contemplated. Thus, the invention contemplates the interferometric measurement of any external parameter by the use of a first branch which is substantially optically inactive and by the use of a second branch which is substantially optically active, with reference to the external parameter to be measured. Accordingly, the scope of the invention is to be interpreted only in conjunction with the appended claims.

The embodiments of the invention in which an exclusive property or privilege is claimed are defined as follows:

1. An optical fibre interferometer for providing a light output that is modulated in relation to an external parameter, comprising:
   an input branch, an output branch, and first and second intermediate branches, each of said branches being optically transmissive and one of said intermediate branches comprising an optical fibre;
   means optically coupling said input branch to said first and second intermediate branches, and means optically coupling said first and second intermediate branches to said output branch;
   said first intermediate branch being composed substantially of material that is substantially optically inactive when subjected to the external parameter, and said second intermediate branch being composed substantially of material that is substantially optically active when subjected to the external parameter, said external parameter being produced by a source substantially removed from the optical fibre interferometer.

2. The optical fibre interferometer of claim 1, wherein said external parameter is an electromagnetic field, and wherein said first intermediate branch is substantially composed of material that is substantially non-electrooptic and said second intermediate branch is substantially composed of material that is substantially electrooptic.

3. The optical fibre interferometer of claim 2, wherein said interferometer consists entirely of optical fibres, and wherein each said means optically coupling said branches is a splice between said optical fibres.

4. The optical fibre interferometer of claim 3, wherein said substantially electrooptic material is lithium niobate.

5. The optical fibre interferometer of claim 3, wherein said substantially electrooptic material is lithium tantalate.

6. The optical fibre interferometer of claim 3, wherein said substantially non-electrooptic material is silicon dioxide.

7. The optical fibre interferometer of claim 2, wherein said first intermediate branch consists of an optical fibre, and wherein said second intermediate branch includes an optical waveguide consisting of substantially electrooptic material.

8. The optical fibre interferometer of claim 7, wherein said optical waveguide is formed by metallic diffusion into a substrate of substantially electrooptic material.

9. The optical fibre interferometer of claim 8, wherein said optical waveguide is formed in a substrate of lithium niobate by indiffusion of titanium.

10. The optical fibre interferometer of claim 7, wherein said second intermediate branch includes: an optical fibre having a first portion extending from said input branch to one end of said waveguide, and a second portion extending from the other end of said waveguide to said output branch; and, means optically coupling said first and second portions of said optical fibre to the respective ends of said waveguide.

11. The optical fibre interferometer of claim 10, wherein said optical fibre in said second intermediate branch is composed of substantially nonelectrooptic material.

12. The optical fibre interferometer of claim 10, wherein each said means optically coupling said branches is a splice between said fibres.

13. The optical fibre interferometer of claim 10, wherein each said means optically coupling said optical fibre to said waveguide in said second intermediate branch is a lens.

14. An optical fibre interferometer for providing a light output that is modulated in relation to an external parameter, comprising:
   an input branch, an output branch, and first and second intermediate branches, each of said branches being optically transmissive;
   means optically coupling said input branch to said first and second intermediate branches, and means optically coupling said first and second intermediate branches to said output branch;
   said first intermediate branch being composed substantially of material that is substantially optically inactive when subjected to the external parameter, and said second intermediate branch being composed substantially of material that is substantially optically active when subjected to the external parameter;
   said input branch, said output branch and said first intermediate branch together comprising a single optical fibre length that has been notched to define a longitudinal substantially planar surface therein, said second intermediate branch comprising a waveguide formed on said longitudinal surface.

15. The optical fibre interferometer of claim 14, wherein said external parameter is an electromagnetic field, and wherein said first intermediate branch substantially comprises a material that is substantially nonelectrooptic and said second intermediate branch substantially comprises a material that is substantially electrooptic, and thus is an electrooptic waveguide.

16. The optical fibre interferometer of claim 15, wherein said electrooptic waveguide is formed by deposition of a layer of said substantially electrooptic material on said longitudinal surface.

17. The optical fibre interferometer of claim 16, wherein said means optically coupling said input branch to said second intermediate branch, and said means optically coupling said second intermediate branch to said output branch, each includes: an end face defined in said optical fibre length adjacent an end of said longitudinal surface therein; and, a grating coupler formed in said waveguide adjacent said end face.

18. The optical fibre interferometer of claim 15, wherein said substantially non-electrooptic material is silicon dioxide and said substantially electrooptic material is niobium pentoxide

* * * * *